United States Patent [19]

Nagai et al.

[11] Patent Number: 5,469,457
[45] Date of Patent: Nov. 21, 1995

[54] SEMICONDUCTOR LASER WITH COD PREVENTING DISORDERED REGIONS

[75] Inventors: Yutaka Nagai; Akihiro Shima, both of Hyogo, Japan

[73] Assignee: Mitsubishi Denki Kabushiki Kaisha, Tokyo, Japan

[21] Appl. No.: 149,958

[22] Filed: Nov. 10, 1993

[30]  Foreign Application Priority Data

Apr. 12, 1993  [JP]  Japan .................... 5-084738

[51] Int. Cl.$^6$ .............................. H01S 3/18; H01S 3/085
[52] U.S. Cl. .................... 372/45; 372/44; 372/46
[58] Field of Search ................ 372/45, 46, 43, 372/44, 103

[56]  References Cited

U.S. PATENT DOCUMENTS

| | | | |
|---|---|---|---|
| 4,961,196 | 10/1990 | Endo | 372/45 |
| 5,020,068 | 5/1991 | Isshiki | 372/46 |
| 5,031,185 | 7/1991 | Murakami et al. | 372/46 |
| 5,045,500 | 9/1991 | Mitsui et al. | 437/129 |
| 5,065,404 | 11/1991 | Okajima et al. | 372/46 |
| 5,171,707 | 12/1992 | Takahashi | 437/129 |
| 5,331,657 | 7/1994 | Yoo et al. | 372/46 |

FOREIGN PATENT DOCUMENTS

| | | | |
|---|---|---|---|
| 1319981 | 12/1989 | Japan . | |
| 2106986 | 4/1990 | Japan . | |
| 0102590 | 4/1990 | Japan | 372/45 |
| 0080589 | 4/1991 | Japan | 372/46 |
| 5129721 | 5/1993 | Japan | 372/45 |

OTHER PUBLICATIONS

Nakashima et al., "AlGaAs Window Stripe Buried Multi-quantum Well Lasers", Japanese Journal of Applied Physics, vol. 24, No. 8, Aug., 1985, pp. L647–L649.

Thornton et al., "High Power (2.1 W) 10–Stripe AlGaAs Laser Arrays With Si Disordered Facet Windows", Applied Physics Letter 49 (23), Dec. 8, 1986, pp. 1572–1574.

Kuroi et al., "Characteristics of Junction Leakage Current of Buried Layer Formed by High Energy Ion Implantation", Extended Abstracts of the 22nd (1990 International) Conference on Solid State Devices and Materials, Sendai, 1990, pp. 441–444 no month.

*Primary Examiner*—Rodney B. Bovernick
*Assistant Examiner*—Robert McNutt
*Attorney, Agent, or Firm*—Leydig, Voit & Mayer

[57]  ABSTRACT

A semiconductor laser includes: a first conductivity type semiconductor substrate; a first conductivity type lower cladding layer disposed on the substrate; a quantum well structure disposed on the lower cladding layer; a second conductivity type upper cladding disposed on the quantum well structure; a ridge including a stripe-shaped second conductivity type semiconductor of a length extending in the laser resonator length direction reaching neither semiconductor laser facet and disposed on the upper cladding layer; disordered regions, i.e, window structures, formed in the quantum well structure in the vicinity of the laser resonator facets by ion-implanting a dopant impurity; and a first conductivity type current blocking layer, disposed on the upper cladding layer on the disordered quantum well structure layer, burying the ridge. Accordingly, in the window structure regions, flow of a current that does not produce laser light is prevented, resulting in a semiconductor laser having a high power light output, a low threshold current, and a low operational current.

4 Claims, 9 Drawing Sheets

Fig. 7 (a) Prior Art
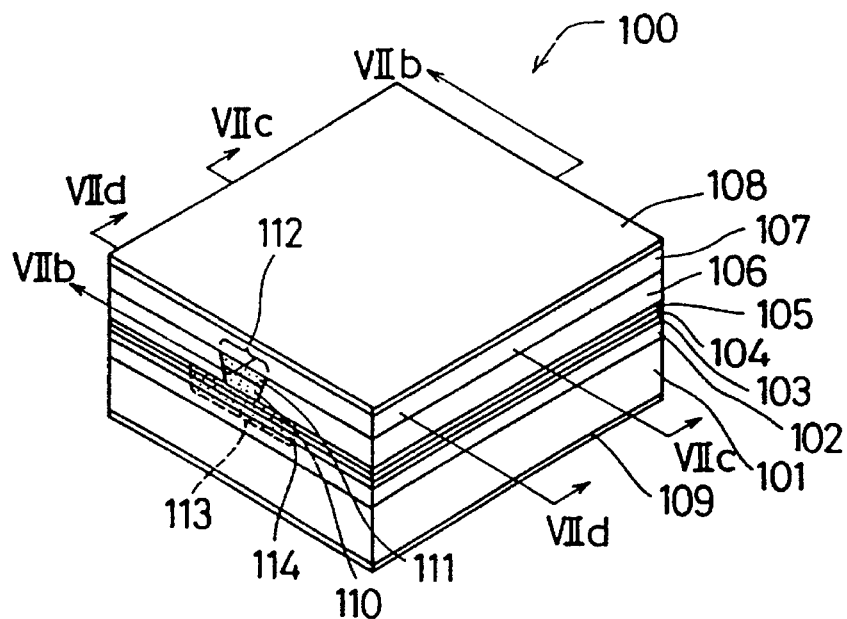
Fig. 7 (b) Prior Art
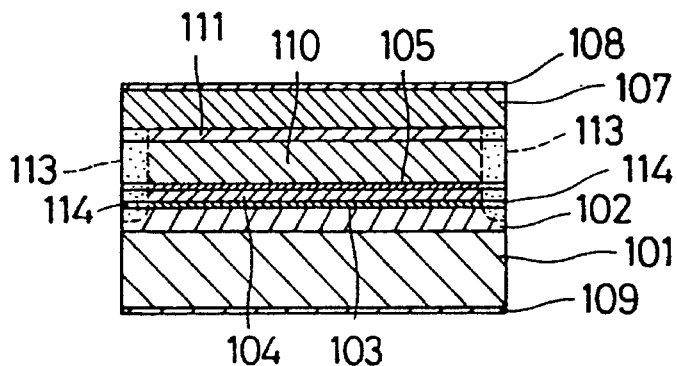
Fig. 7 (c) Prior Art
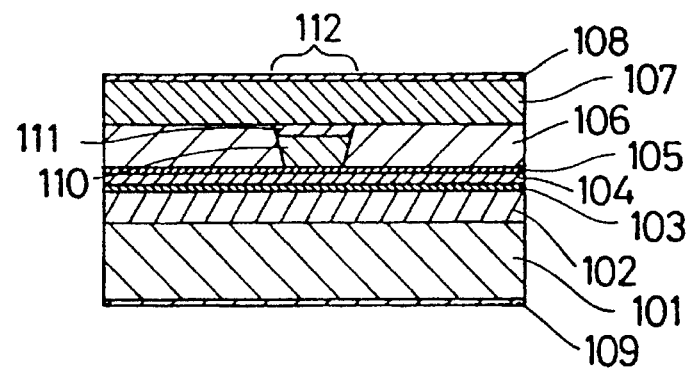
Fig. 7 (d) Prior Art
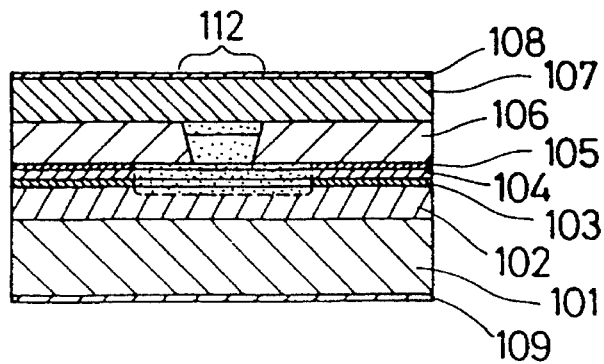

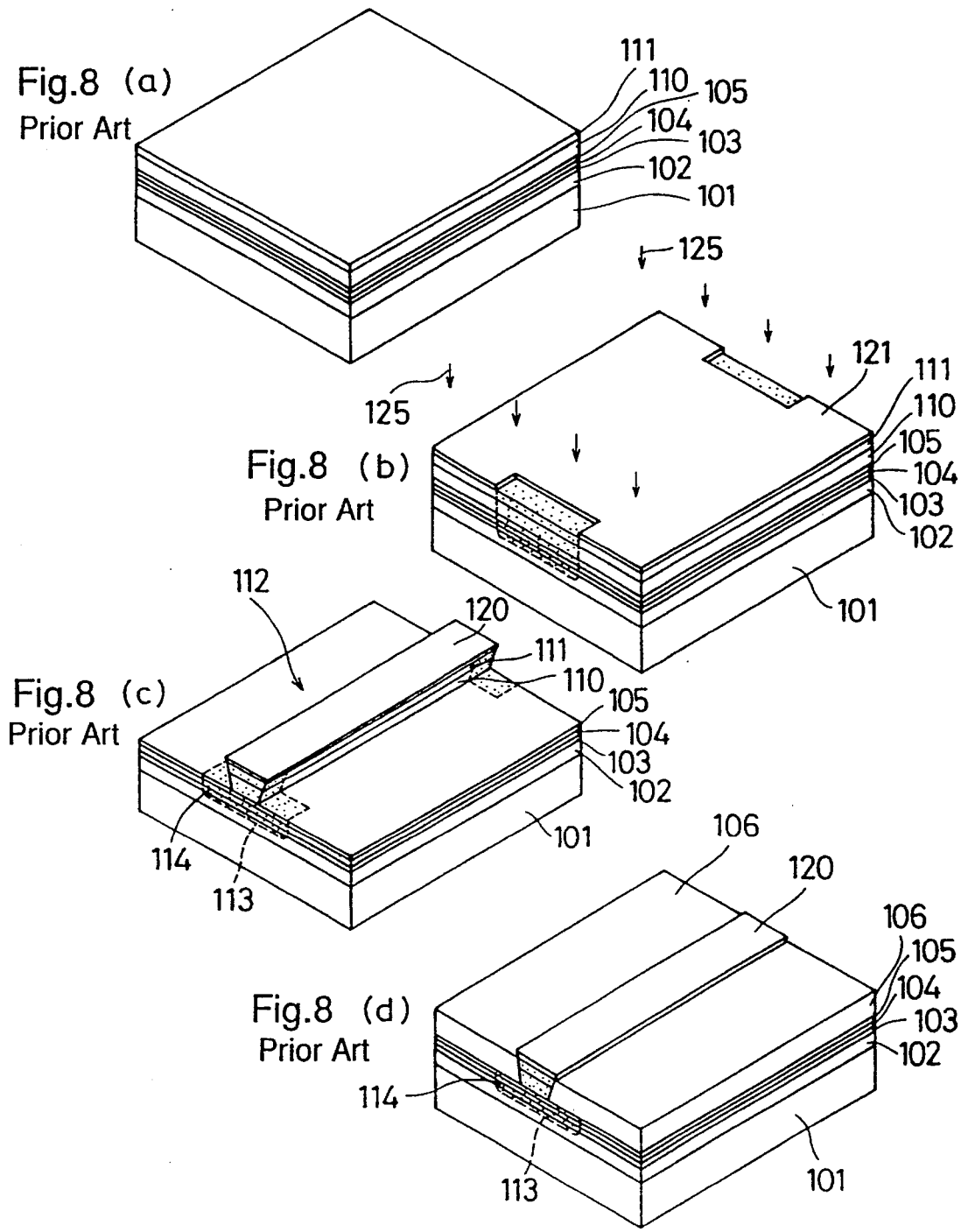
Fig.8 (a) Prior Art
Fig.8 (b) Prior Art
Fig.8 (c) Prior Art
Fig.8 (d) Prior Art Fig.9 (a) Prior Art
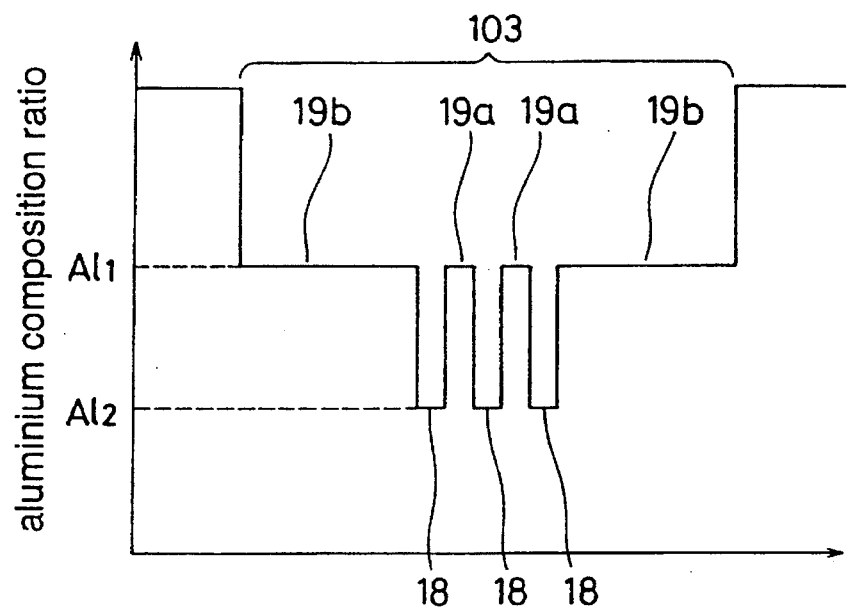
Fig.9 (b) Prior Art
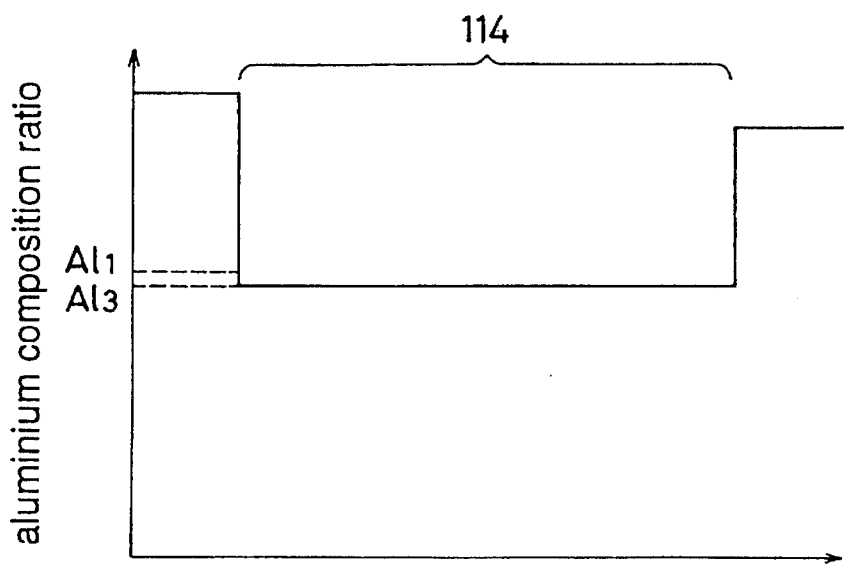

SEMICONDUCTOR LASER WITH COD PREVENTING DISORDERED REGIONS

FIELD OF THE INVENTION

The present invention relates to a semiconductor laser and a production method thereof, and more particularly, to a semiconductor laser having a window structure at laser facets that enables high light output operation.

BACKGROUND OF THE INVENTION

FIG. 7(a) is a perspective view illustrating a prior art semiconductor laser device having a window structure, and FIGS. 7(b), 7(c) and 7(d) are cross-sectional views illustrating cross-sections of the semiconductor laser of FIG. 7(a) taken along lines VIIb—VIIb, VIIc—VIIc, VIId—VIId, respectively. In the figures, reference numeral 100 designates a semiconductor laser device having a length of 300 to 600 μm in the laser resonator length direction and a width of about 300 μm in the laser resonator width direction. Reference numeral 101 designates an n type GaAs semiconductor substrate, and reference numeral 102 designates an n type $Al_{x2}Ga_{1-x2}As$ (Al composition ratio: x2 =0.5) lower cladding layer having a thickness of 1.5 to 2 μm. Reference numeral 103 designates a quantum well layer structure including a triple-layer structure comprising three $Al_{y2}Ga_{1-y2}As$ (Al composition ratio: y2=0.05) well layers (not shown) each about 80Å thick and two $Al_{z2}Ga_{1-z2}As$ (Al composition ratio: z2=0.3 to 0.35) barrier layers (not shown) each 50Å to 80Å thick, alternatingly laminated with each other, and two barrier layers each of 0.2 to 0.3 μm thickness, placed at top and bottom of the quantum well structure layer 103, sandwiching the triple-layer structure. Reference numeral 104 designates a p type $Al_{w2}Ga_{1-w2}As$ (Al composition ratio: w2=0.5) first upper cladding layer of 0.2 to 0.3 μm thickness. Reference numeral 105 designates a p type $Al_{q2}Ga_{1-q2}As$ (Al composition ratio: q2=0.7) etching stopper layer of about 200Å thickness. Reference numeral 110 designates a p type $Al_{t2}Ga_{1-t2}As$ (Al composition ratio: t2=0.5) second upper cladding layer of 0.8 to 1.3 μm thickness. Reference numeral 111 designates a p type GaAs first contact layer of about 0.7 μm thickness. Reference numeral 106 designates an n type GaAs current blocking layer of 1.0 to 2 μm thickness. Reference numeral 107 designates a p type GaAs second contact layer of 2 to 3 μm thickness. Reference numerals 108 and 109 designate a p side electrode and an n side electrode, respectively. Reference numeral 112 designates a ridge produced in a reverse-trapezoid configuration of about 4 μm width in the laser resonator width direction closest to n side electrode 109 and of about 5 to 6 μm width in the laser resonator width direction closest to p side electrode 108. Reference numeral 113 designates a region into which Zn is diffused. Reference numeral 114 designates a region in the quantum well layer structure 103 where the quantum well layer structure is disordered by Zn of about 50 μm width in the resonator width direction.

FIGS. 8(a) to 8(d) are perspective views illustrating process steps in producing the prior art semiconductor laser having a window structure. In the figures, the same reference numerals as those in FIGS. 7(a) to 7(d) designate the same or corresponding elements. Reference numeral 121 designates a first insulating film, reference numeral 120 designates a second insulating film for producing the ridge, and reference numeral 125 designates Zn diffusion.

A description will be given of a method for producing this semiconductor laser. First, as shown in FIG. 8(a), a cladding layer 102, a quantum well layer structure 103, a first cladding layer 104, an etching stopper layer 105, a second cladding layer 110, and a first contact layer 111 are epitaxially grown successively in this order on the surface of a semiconductor substrate 101. Next, a first photoresist 121 is formed on the first contact layer 111. The first photoresist 121 is patterned to produce apertures in the vicinity of both the laser resonator facets, and Zn 125 is diffused into regions which are to be the resonator facets using the patterned photoresist 121 as a mask as shown in FIG. 8(b). The Zn diffusion concentration is $1\times10^{19}$ to $1\times10^{20}$ $cm^{-3}$. Subsequently, the wafer is annealed to disorder the quantum well structure layer. The quantum well structure layer can be also disordered not by conducting annealing at this time but by heat generated at the crystal growth in a later process step after the Zn diffusion. Next, as shown in FIG. 8(c), after the first photoresist 121 is removed, the first contact layer 111 and the second cladding layer 110 are etched to have a stripe configuration up to the surface of the etching stopper layer 105 using the second photoresist 120 as a mask to form a ridge 112. Subsequently as shown in FIG. 8(d), a current blocking layer 106 is selectively grown on the etching stopper layer 105 at the both sides of the ridge 112 so as to bury the ridge 112, and the second photoresist 120 is removed. Thereafter, a second contact layer 107 and a p side electrode 108 are successively formed on the ridge 112 and the current blocking layer 106, and an n side electrode 109 is formed on the rear surface of the semiconductor substrate 101, thereby completing a semiconductor laser 100 shown in FIG. 7(a).

The semiconductor laser operates as follows. When a voltage is applied to the semiconductor laser device 100 making the p side electrode 108 plus and the n side electrode 109 minus, holes are injected into the quantum well layer structure 103 through the p type GaAs second contact layer 107, the p type GaAs first contact layer 111, the p type $Al_{t2}Ga_{1-t2}As$ (t2=0.5) second cladding layer 110, and the p type $Al_{w2}Ga_{1-w2}As$ (w2=0.5) first cladding layer 104, while electrons are injected into the quantum well layer structure 103 through the n type GaAs semiconductor substrate 101, and the n type $Al_xGa_{1-x}As$ (x= 0.5) cladding layer 102. Then, recombination of the electrons and holes occurs in the quantum well layer structure 103, whereby induced light emission is generated. When the amount of the injected carriers is sufficiently large to generate light of a magnitude larger than the loss in the waveguide path, laser oscillation occurs.

A description will be given of the ridge structure. In the semiconductor laser 100 having the ridge structure shown in FIG. 7(a), in a region covered with the n type GaAs current blocking layer 106 other than the stripe-shaped ridge portion 112, p-n junctions are formed between the p type AlGaAs first cladding layer 104 and the n type GaAs current blocking layer 106 and between the p type GaAs second contact layer 107 and the n type GaAs current blocking layer 106. Therefore, even when a voltage is applied making the p side electrode 108 plus, no current flows in the region other than the ridge region 112 where the p-n-p junction is produced to form a reverse bias. In other words, the n type GaAs current blocking layer 106 literally functions to block the current flow. Accordingly, current flows only through the ridge region 112 and is concentrated to a region of the quantum well layer structure 103 close to the ridge reaching a large current density sufficient for laser oscillation. Furthermore, the n type GaAs current blocking layer 106 has a characteristic of absorbing laser light emitted in the quantum well layer structure 103, because the energy band gap of GaAs is smaller than the effective energy band gap of the quantum well layer structure 103 based on the quantization effect. Therefore, the laser light is subjected to strong absorption at both sides of the ridge region 112 and is concentrated only in the vicinity of the ridge region 112. As a result, laser light which has a stable single mode and a horizontal transverse mode, which is important among the semiconductor laser operation characteristics, is obtained.

Next, the window structure will be described. In an AlGaAs series semiconductor laser which emits laser light of a 0.8 μm band wavelength, which is generally used as a light source for an optical disc device such as a compact disc, the maximum light output is limited to the light output at which the laser resonator facet destruction occurs. The laser resonator facet destruction is induced by the semiconductor laser active layer, which is melted by heat generated by laser light absorption at the facet region, that the laser resonator facet destruction is induced, so that no resonance occurs. Accordingly, in order to realize the high light output operation, a device preventing facet destruction even at high light output is required. To realize this, a structure that makes laser light difficult to be absorbed at the facet region, i.e., a window structure that is "transparent" to laser light in the laser resonator facet region is quite effective. This window structure is formed such that the energy band gap at the region in the vicinity of the laser resonator facet is higher than that at the active layer which emits laser light. In the semiconductor laser 100 shown in FIG. 7(a) in which the quantum well structure layer 103 serves as an active layer, this window structure is formed utilizing the disordering of the quantum well layer structure 103 by Zn diffusion as shown by the production method of FIG. 8(b).

FIG. 9(a) is a diagram illustrating a profile of aluminum composition ratio in the quantum well layer structure 103 before being disordered by Zn diffusion, and FIG. 9(b) is a diagram illustrating a profile of aluminum composition ratio in the quantum well layer structure 114 after being disordered by the Zn diffusion. In the figures, reference numerals 19a and 19b designate $Al_zGa_{1-z}As$ ($0.3 \leq z \leq 0.35$) barrier layers, reference numeral 18 designates an $Al_yGa_{1-y}As$ (y=0.05) well layer, reference numeral $Al_1$ designates an aluminum composition ratio of the barrier layers 19a and 19b, reference numeral $Al_2$ designates an aluminum composition ratio of the well layer 18, and reference numeral $Al_3$ designates an aluminum composition ratio of the disordered region 114 in the quantum well layer structure 103.

When an impurity such as Zn or Si is diffused into the quantum well layer structure 103, atoms constituting the well layers 18 and the barrier layers 19a and 19b are mixed with each other. As a result, since the well layer 18 is thinner than the barrier layer 19b, the Al composition ratio $Al_3$ of the quantum well layer structure 114 after the diffusion becomes almost equal to the Al composition ratio $Al_1$ of the barrier layers 19a and 19b before the diffusion as shown in the FIGS. 9(a) and 9(b), and the effective energy band gap of the quantum well layer structure 103 becomes approximately equal to the energy band gap of the barrier layers 19a and 19b. Thus, the energy band gap of the quantum well structure 114 disordered by the Zn diffusion becomes larger than the effective energy band gap of the non-disordered quantum well layer structure 103, whereby a window structure "transparent" to laser light is obtained.

While the prior art ridge structure semiconductor laser having a window structure constituted as described above, is very effective in preventing the destruction of a laser resonator facet, it has the problems described below:

In the region in the vicinity of the laser resonator facet where Zn is diffused, the impurity concentration increases, resulting in a reduced resistance, whereby a current injected from the electrode flows made easily through this region, but because there is no quantum well structure layer emitting laser light in this Zn diffused region, the current flowing through this region becomes an unavailable current that makes no contribution to laser oscillation at all. As a result, in this prior art semiconductor laser having a window structure, this unavailable current, likely to flow, causes a quite high threshold current and a quite high operational current.

SUMMARY OF THE INVENTION

It is an object of the present invention to provide a semiconductor laser having a window structure that prevents generation of an unavailable current.

It is another object of the present invention to provide a method for producing this semiconductor laser.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor laser includes: a first conductivity type lower cladding layer disposed on a substrate; a quantum well structure layer disposed on the lower cladding layer; a second conductivity type upper cladding layer disposed on the quantum well structure layer; a ridge comprising a stripe-shaped second conductivity type semiconductor of a length extending in the laser resonator length direction, which reaches neither semiconductor laser resonator facet, disposed on the upper cladding layer; disordered regions formed in the quantum well structure layer in the vicinity of both laser resonator facets by the introduction of an impurity; and a first conductivity type current blocking layer disposed on the upper cladding layer at the periphery of the ridge so as to bury the ridge. Thus, the quantum well structure has window structures in the vicinity of laser resonator facets formed by disordering by ion-implantation of an impurity, and a first conductivity type current blocking layer is disposed on the first upper cladding layer disposed on the disordered quantum well structure layer, so that a junction of first conductivity type, second conductivity type, and first conductivity type is formed between the current blocking layer and the substrate in regions in which the window structures are formed, preventing the flow generation of an unavailable current in the window structure, whereby a semiconductor laser having a high light output and having a low threshold current and a low operational current can be easily obtained.

According to a second aspect of the present invention, a semiconductor laser includes: a first conductivity type lower cladding layer disposed on a substrate; a quantum well structure layer disposed on the lower cladding layer; a second conductivity type upper cladding layer disposed on the quantum well structure layer; a ridge comprising a stripe-shaped second conductivity type semiconductor of a length extending in the laser resonator length direction which reaches neither semiconductor laser resonator facet, disposed on the upper cladding layer; disordered regions formed in the quantum well structure layer in the vicinity of both laser resonator facets by the introduction of an impurity; and a first conductivity type current blocking layer, which is so formed on the upper cladding layer at the periphery of the ridge as to bury the ridge, having an energy band gap larger than the effective energy band gap of the quantum well structure layer and having a refractive index smaller than that of the semiconductor constituting the ridge. Thus, the quantum well structure layer has window structures in the vicinity of both the laser resonator facets, formed by disordering by ion-implantation of an impurity, and the first conductivity type current blocking layer is disposed on the first upper cladding layer disposed on the disordered quantum well structure layer, so that a junction of first conductivity type, second conductivity type, and first conductivity type is formed between the current blocking layer and the substrate in regions in which the window structures are formed, preventing the flow of an unavailable current in the window structure. In addition, since the current blocking layer has an energy band gap larger than that of the quantum well structure layer, the current blocking layer absorbs no laser light which is generated in the quantum well structure layer, and causes little loss of the laser resonator. Therefore, a semiconductor laser having a high light output and having a low threshold current and a low operational current can be easily obtained.

According to a third aspect of the present invention, a production method of a semiconductor laser includes: forming a first conductivity type lower cladding layer, a quantum well structure layer, a second conductivity type first upper cladding layer, and a second conductivity type second upper cladding layer successively in this order on a substrate; etching the second upper cladding layer using an insulating film pattern formed on the second upper cladding layer as a mask to form a stripe-shaped ridge which reaches neither laser resonator facet; carrying out ion-implantation of impurity over the first upper cladding layer into both regions in the quantum well structure layer in the vicinity of both laser resonator facets at a concentration not inverting the conductivity type of the first upper cladding layer, and thereby disordering the quantum well structure in the region into which the ion-implantation is carried out to form a window structure; and growing a first conductivity type current blocking layer on the first upper cladding layer so as to bury the ridge. Thus, in each region where the window structure is formed, a junction of first conductivity type, second conductivity type, and first conductivity type is formed between the current blocking layer and the substrate, preventing the flow of an unavailable current in the window structure. Therefore, a semiconductor laser having a high light output and having a low threshold current and a low operational current can be easily obtained.

According to a fourth aspect of the present invention, a production method of a semiconductor laser includes: forming a first conductivity type lower cladding layer, a quantum well structure layer, a second conductivity type first upper cladding layer, and a second conductivity type second upper cladding layer successively in this order on a substrate; etching the second upper cladding layer using an insulating film pattern formed on the second upper cladding layer as a mask to form a stripe-shaped ridge which reaches neither laser resonator facet; carrying out ion-implantation of an impurity over the first upper cladding layer into the quantum well structure layer, but not into a portion under the ridge, using the insulating film pattern formed on the ridge in place of photoresist as a mask, to a concentration not inverting the conductivity type of the first upper cladding layer, and thereby disordering the quantum well structure in each region in which the ion-implantation is carried out to form a window structure; and growing a first conductivity type current blocking layer on the first upper cladding layer so as to bury the ridge. Thus, a junction of first conductivity type, second conductivity type, and first conductivity type is formed between the current blocking layer and the substrate, preventing the flow of an unavailable current in the window structure. Therefore, a semiconductor laser, having a high light output and having a low threshold current and a low operational current, furthermore, in which a defect is unlikely to be induced during selective crystal growth when forming the current blocking layer because no surface contamination is caused by the photoresist, can be easily obtained.

BRIEF DESCRIPTION OF THE DRAWINGS

FIG. 7(a) is a perspective view and FIGS. 7(b) to 7(d) are cross-sectional views, all illustrating a structure of a prior art semiconductor laser.

FIGS. 8(a) to 8(d) are perspective views illustrating process steps in a production method of the prior art semiconductor laser.

FIGS. 9(a) and 9(b) are diagrams showing aluminum composition ratios in a quantum well structure layer of the prior art semiconductor laser.

DETAILED DESCRIPTION OF THE PREFERRED EMBODIMENTS

Embodiment 1.

Figure 1:
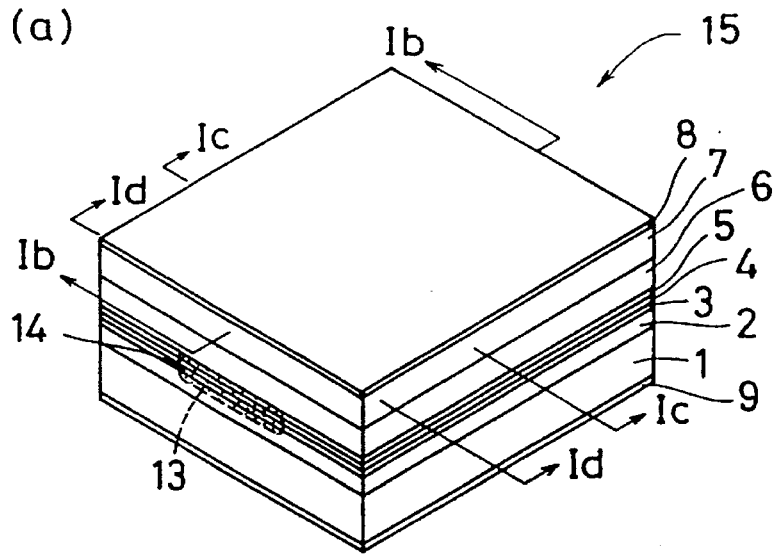
FIG. 1(a) is a perspective view and FIGS. 1(b) to 1(d) are cross-sectional views, all illustrating a structure of a semiconductor laser in accordance with a first embodiment of the present invention.
Figure 1:
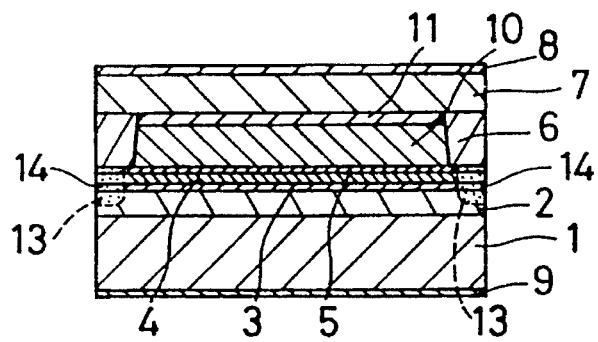
Figure 1:
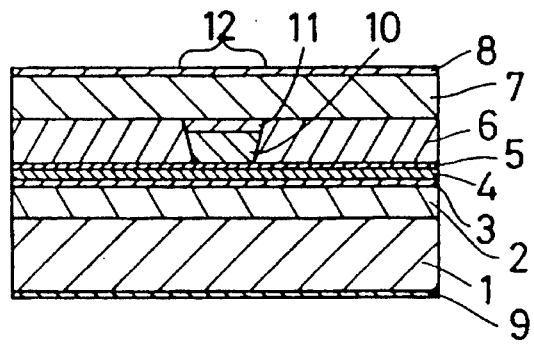
Figure 1:
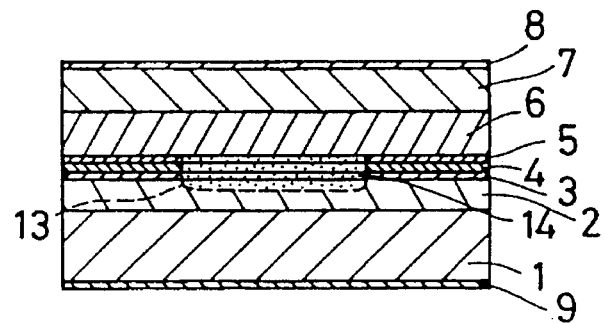

FIG. 1(a) is a perspective view illustrating a semiconductor laser according to a first embodiment of the present invention. FIGS. 1(b), 1(c), and 1(d) are cross-sectional views illustrating cross-sections of the semiconductor laser shown in FIG. 1(a) taken along lines Ib—Ib, Ic—Ic, and Id—Id, respectively. FIG. 1(b) shows a cross-section of the semiconductor laser in the resonator length direction, FIG. 1(c) shows a cross-section of the semiconductor laser in a ridge structure region, and FIG. 1(d) Shows a cross-section of the semiconductor laser in a window structure region. In the figures, reference numeral 1 designates an n type GaAs semiconductor substrate, reference numeral 2 designates an n type $Al_{x1}Ga_{1-x1}As$ (Al composition ratio: x1=0.5) lower cladding layer of 1.5 to 2 μm thickness, and reference numeral 3 designates a quantum well layer structure including a triple-layer structure comprising three $Al_{y1}Ga_{1-y1}As$ (Al composition ratio: y1= 0.05) well layers (not shown) each about 80Å thickness and two $Al_{z1}Ga_{1-z1}As$ (Al composition ratio: z1=0.3 to 0.35) barrier layers (not shown) each of 50Å to 80Å thickness, alternatingly laminated with each other, and two barrier layers each of 0.2 to 0.3 μm thickness, placed at top and bottom of the quantum well structure layer, sandwiching the triple-layer structure. Reference numeral 4 designates a p type $Al_{w1}Ga_{1-w1}As$ (Al composition ration: w1=0.5) first cladding layer of 0.2 to 0.3 μm thickness, reference numeral 5 designates a p type $Al_{q1}Ga_{1-q1}As$ (Al composition ratio: q1 =0.7) etching stopper layer of about 200Å thickness. Reference numeral 10 designates a p type $Al_{t1}Ga_{1-t1}As$ (Al composition ratio: t1=0.5) second cladding layer of 0.8 to 1.3 μm thickness, reference numeral 11 designates a p type GaAs first contact layer of about 0.7 μm thickness. Reference numeral 6 designates an n type $Al_{r1}Ga_{1-r1}As$ (Al composition ratio: r1=0) current blocking layer of 1.5 to 2 μm thickness, reference numeral 7 designates a p type GaAs second contact layer of 2 to 3 μm thickness, reference numeral 8 designates a p side electrode, reference numeral 9 designates an n side electrode. Reference numeral 12 designates a ridge formed to have a reverse-trapezoid configuration having a width of about 4 μm in the resonator width direction closest to the n side electrode 9 and a width of 5 to 6 μm in the resonator width direction closest to the p side electrode 8. Reference numeral 15 designates a semiconductor laser chip having a length of 300 to 600 μm in the resonator length direction and a width of about 300 μm in the resonator width direction. Reference numeral 13 designates a region into which silicon is ion-implanted, and reference numeral 14 designates a region in the quantum well layer structure 3, where the quantum layer structure is disordered by ion-implantation of silicon, having a width of about 50 μm in the resonator width direction.

FIGS. 2(a) to 2(f) are perspective views illustrating a production method for producing a semiconductor laser chip according to a first embodiment of the present invention. In the figures, the same reference numerals as those in FIGS. 1(a) to 1(d) designate the same or corresponding elements. Reference numeral 20 designates an insulating film, reference numeral 21 designates photoresist, and reference numeral 22 designates an aperture.

Figure 2:
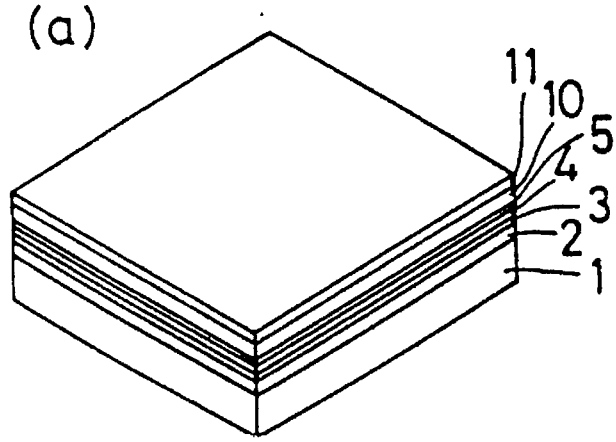
FIGS. 2(a) to 2(f) are perspective views illustrating process steps of producing the semiconductor laser in accordance with the first embodiment of the present invention.
Figure 2:
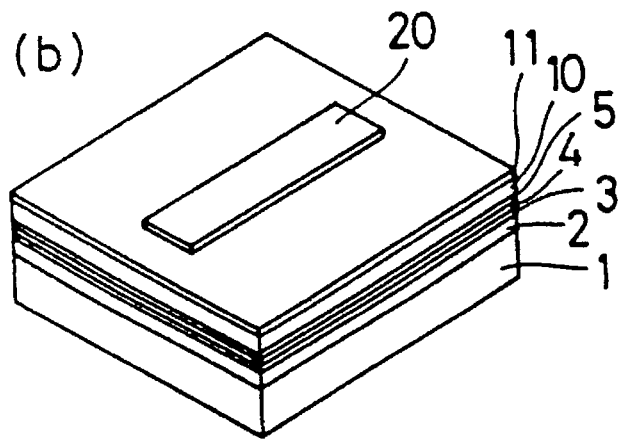
Figure 2:
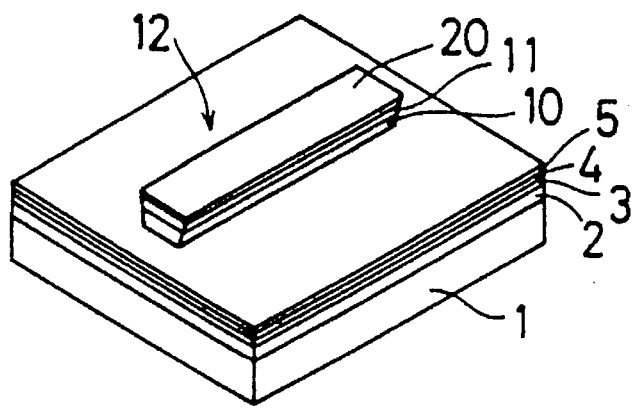
Figure 2:
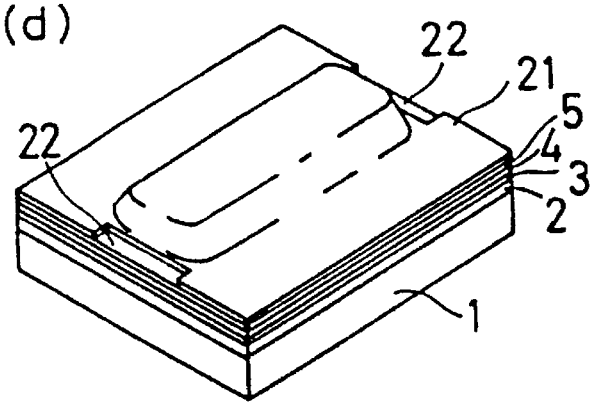
Figure 2:
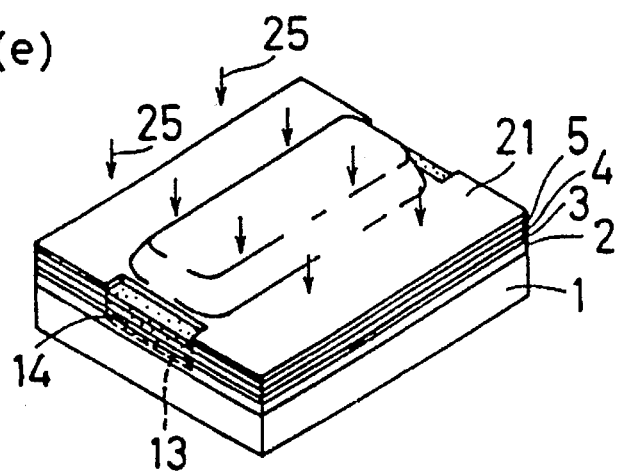
Figure 2:
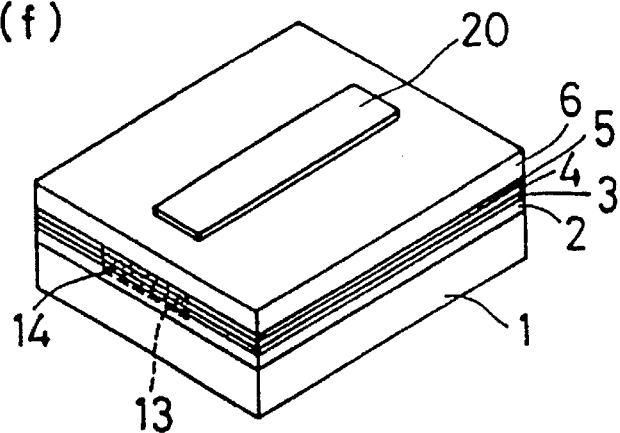

The production method of the semiconductor laser will be described with reference to FIGS. 2(a) to 2(f) below. A lower cladding layer 2, a quantum well layer structure 3, a first upper cladding layer 4, an etching stopper layer 5, a second upper cladding layer 10, and a first contact layer 11 are epitaxially grown successively in this order on an n type GaAs semiconductor substrate 1 as shown in FIG. 2(a). An insulating film 20 is formed on the entire surface of the wafer. $Si_3N_4$, $SiO_2$, or the like is employed as material for the insulating film. Subsequently, the insulating film 20 is patterned to be stripe-shaped having a width of about 8 μm in the resonator width direction and spaced a distance of about 20 μm from the semiconductor laser resonator facet as shown in FIG. 2(b).

The insulating film 20 functions as a mask for ridge-etching. As shown in FIG. 2(c), the etching is conducted to the entire surface of the wafer using the insulating film 20 as a mask to form a ridge configuration. For the etching, a selective etchant that etches the p type GaAs first contact layer 11 and the p type $Al_{t1}Ga_{1-t1}As$ (t1=0.5) second cladding layer 10 but does not etch the p type $Al_{q1}Ga_{1-q1}As$ (q1=0.7) etching stopper layer 5, is used to form the ridge 12 with good repeatability. A mixture of tartaric acid and hydrogen peroxide is given as an example of that selective etchant.

After forming the ridge 12, the entire surface of the wafer is covered with photoresist 21, and the photoresist 21 is patterned to have apertures 22 for ion-implantation, each having a width of about 50 μm in the resonator width direction and having a length reaching a facet of the ridge 12 from the laser resonator facet, by photolithography as shown in FIG. 2(d).

As shown in FIG. 2(e), silicon is ion-implanted into the wafer. No ions are implanted into the portion covered with the photoresist 21, but silicon is ion-implanted into the crystalline portions in the apertures 22. Here, the quantum well layer structure 3 is not disordered by ion-implantation and it is for the first time disordered when silicon atoms are diffused in crystals by some thermal process. Actually, the wafer is annealed to diffuse silicon atoms after the ion-implantation, thereby silicon atoms are diffused to produce disordered quantum well structure layers 14, i.e., regions which function as window structures. Alternatively, by utilizing heat generated during crystal growth after the ion-implantation, silicon diffusion is effected. Next, as shown in FIG. 2(f), an n type $Al_{r1}Ga_{1-r1}As$ (r1=0) current blocking layer 6 is selectively grown on the surface of the wafer so as to bury the ridge 12. Then, the insulating film 20 formed on the ridge 12 functions as a mask and the current blocking layer 6 will not grow on the ridge 12. Thereafter, the insulating film 20 is removed by wet-etching or dry-etching, a p type GaAs second contact layer 7 is grown on the entire surface of the wafer, an n side electrode 9 is formed on the rear surface of the n type GaAs semiconductor substrate 1, and a p side electrode 8 is formed on the p type GaAs second contact layer 7 to complete a semiconductor laser chip 15 having a window structure shown in FIG. 1(a).

Figure 3:
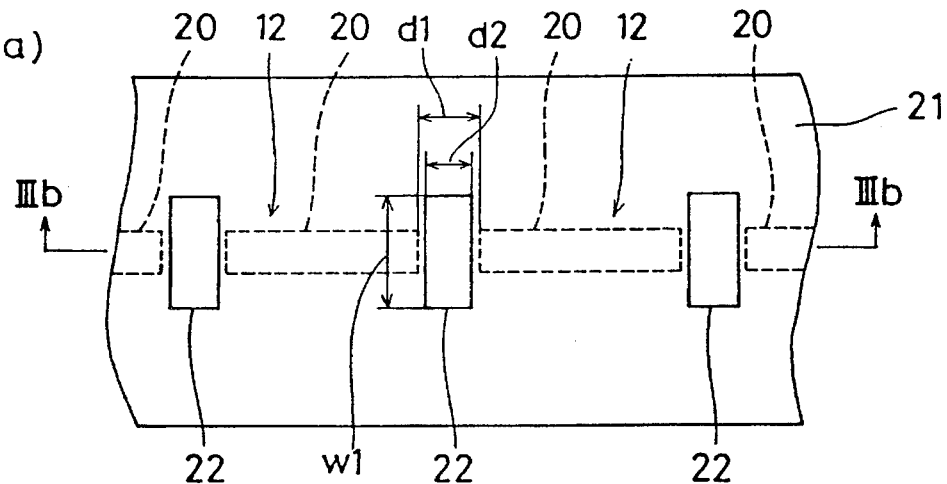
FIG. 3(a) is a plan view and FIG. 3(b) and 3(c) are cross-sectional views, all illustrating process steps of producing the semiconductor laser in accordance with the first embodiment of the present invention.
Figure 3:
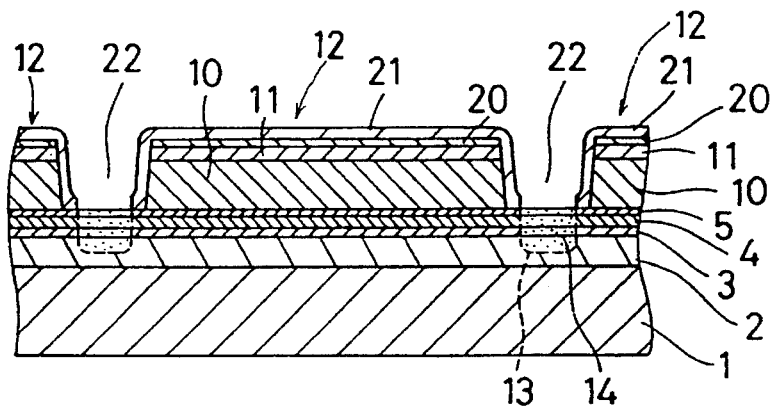
Figure 3:
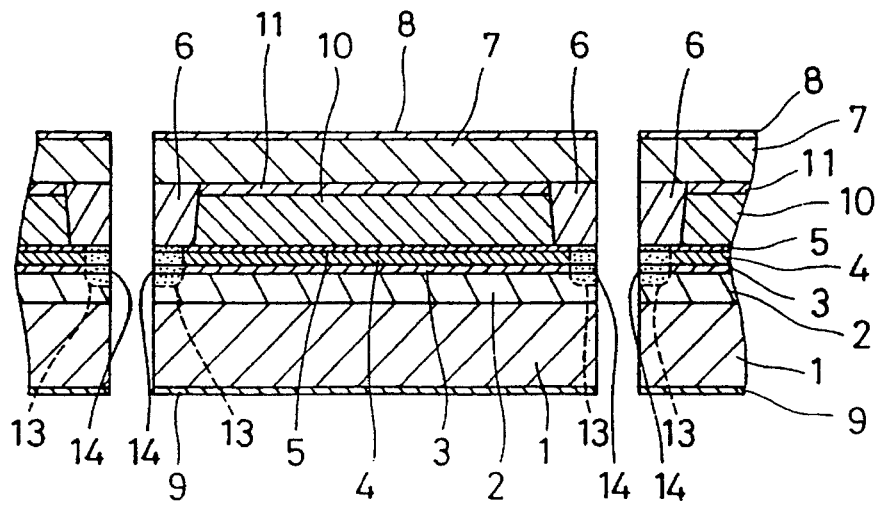

Actually, a plurality of above-described semiconductor laser chips are produced at the same time on the same substrate, and FIGS. 3(a) to 3(c) show process steps of producing the semiconductor laser chips on the same substrate according to the present invention. FIG. 3(a) is a plan view corresponding to the process step for forming the photoresist film 21 shown in FIG. 2(d). FIG. 3(b) is a cross-sectional view illustrating a cross-section of the semiconductor wafer of FIG. 3(a) taken along line IIIb—IIIb corresponding to the process step for ion-implanting silicon shown in FIG. 2(e). FIG. 3(c) is a cross-sectional view illustrating a cross-section of the semiconductor wafer shown taken along FIG. 3(a) in line IIIb—IIIb, corresponding to the process step for cleaving the semiconductor wafer to produce the semiconductor laser chips 15 shown in FIG. 1(a) after forming the second contact layer 7 and the electrodes 8 and 9. As shown in FIG. 3(c), since the semiconductor chip is obtained by cleaving the semiconductor wafer, the interval in the resonator length direction between two adjacent ridges 12 is required to be long enough for cleavage without inducing any problems. In FIG. 3(a), the ridges 12 are arranged with intervals d1 of about 40 μm, the width w1 of the aperture 22 in the resonator width direction is about 50 μm, and the width d2 of the aperture 22 in the resonator length direction is set as close as possible to the interval d1 between the adjacent two ridges 12.

Figure 4:
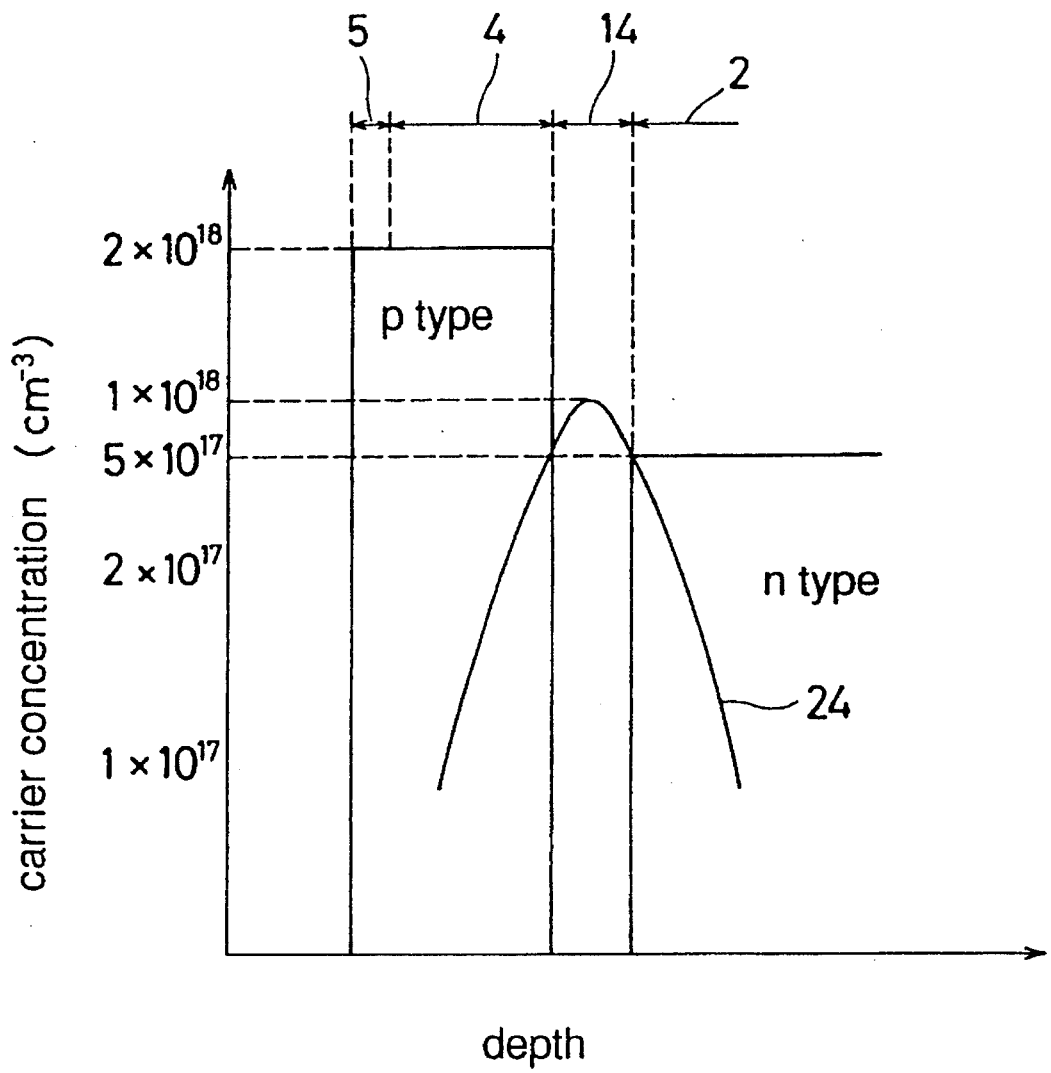
FIG. 4 is a diagram showing a profile of ion-implanted silicon concentration in a semiconductor laser in accordance with the first embodiment of the present invention.

The conditions adopted in the ion-implantation in the process step shown in FIG. 2(e) will be described. FIG. 4 is a diagram illustrating a profile of carrier concentration in an ion-implanted region, that is, a region of the quantum well structure layer 14 serving as a window structure produced by disordering. Since ion-implantation of silicon is carried out after the ridge 12 is produced, layers into which silicon is ion-implanted are portions of the p type $Al_{q1}Ga_{1-q1}As$ (q1= 0.7) etching stopper layer 5, the p type $Al_{w1}Ga_{1-w1}As$ (w1= 0.5) first cladding layer 4, the quantum well layer structure 3, and the n type $Al_{x1}Ga_{1-x1}As$ (x1=0.5) lower cladding layer 2.

There are two restrictions on the ion-implantation. The first is that silicon atoms of a quantity sufficient for disordering the quantum well layer structure 3, i.e., silicon atoms in a concentration more than $1\times10^{18}$ cm$^{-3}$, are required to be injected, and the second is that while silicon atom acts as n type impurity in GaAs crystal, the conductivity type of the p type $Al_{w1}Ga_{1-w1}As$ (w1=0.5) first cladding layer 4 is required not to be inverted to n type by the ion-implanted silicon atoms so as to prevent the window structure region 14 from acting as a path for an unavailable current due to that the first cladding layer 4 being inverted to n type, i.e., the same conductivity type as that of the cladding layer 2.

So as to satisfy these conditions, the ion-implantation is carried out on a condition that the concentration of holes in the p type $Al_{w1}Ga_{1-w1}As$ (w1=0.5) first cladding layer 4 is $2\times10^{18}$ cm$^{-3}$, and the concentration of ion-implanted silicon has a profile 24 in which the peak carrier concentration of $1\times10^{18}$ cm$^{-3}$ is located in the vicinity of the center of the quantum well layer structure 3 as shown in FIG. 4, and thereby the p type $Al_{w1}Ga_{1-w1}As$ (w1=0.5) first cladding layer 4 is not inverted to n type, and the window structure 14 is formed by disordering the quantum well layer structure 3. Then, as a condition for the ion-implantation so as to realize the profile shown in FIG. 4, suppose that the p type $Al_{w1}Ga_{1-w1}As$ (w1=0.5) first cladding layer 4 has an optimum thickness of 0.2 μm to 0.3 μm, the ion-implantation is carried out at the concentration of $1\times10^{14}$ cm$^{-2}$ at an accelerating voltage of 150 KeV into the p type $Al_{w1}Ga_{1-w1}As$ first cladding layer 4 of the above thickness.

As described above, in the semiconductor laser having a window structure according to this first embodiment, it is possible to completely prevent an unavailable current flow through the window structure region, which unavailable current is a defect in the prior art window structure. This can be realized by implanting silicon is an amount sufficient for forming the window structure in the quantum well layer structure region 3, so as not to invert the conductivity type of the first upper cladding layer 4. Thus, a semiconductor laser, having lower threshold current and operational current than the prior art device because no unavailable current flows in the window structure region, and having a window structure for high light output operation is obtained.

In this first embodiment, the ridge is formed by employing selective etching that stops at the p type $Al_{q1}Ga_{1-q1}As$ (q1=0.7) etching stopper layer 5. However, the etching stopper layer 5 is not necessarily required, and the ridge can be formed by non-selective etching and controlling the etching time.

In the above description, although silicon is used as an ion-implanted dopant, any atoms which can cause disordering of the quantum well structure, for example, Zn, may be employed without problems.

Even when this production method is applied to a semiconductor laser having opposite conductivity type respective layers from the first embodiment, the same effects as described above are obtained.

Embodiment 2.

In the first embodiment, photoresist is used as a mask for ion-implantation only into the region where a window structure is to be formed. In the method of the first embodiment, however, when there is some projection like the ridge 12 on the wafer, there is a possibility that the photoresist film is discontinuous at the projection. Furthermore, although the crystal growth is carried out in the process step after the ion-implantation, if the wafer surface is exposed to the photoresist before carrying out the crystal growth, the surface of the wafer is contaminated by organics, thereby harming the crystallinity of the n type $Al_{r1}Ga_{1-r1}As$ (r1=0) current blocking layer 6 which is formed on the wafer surface, resulting in bad surface morphology, or a leakage current flow through the defects.

Figure 5:
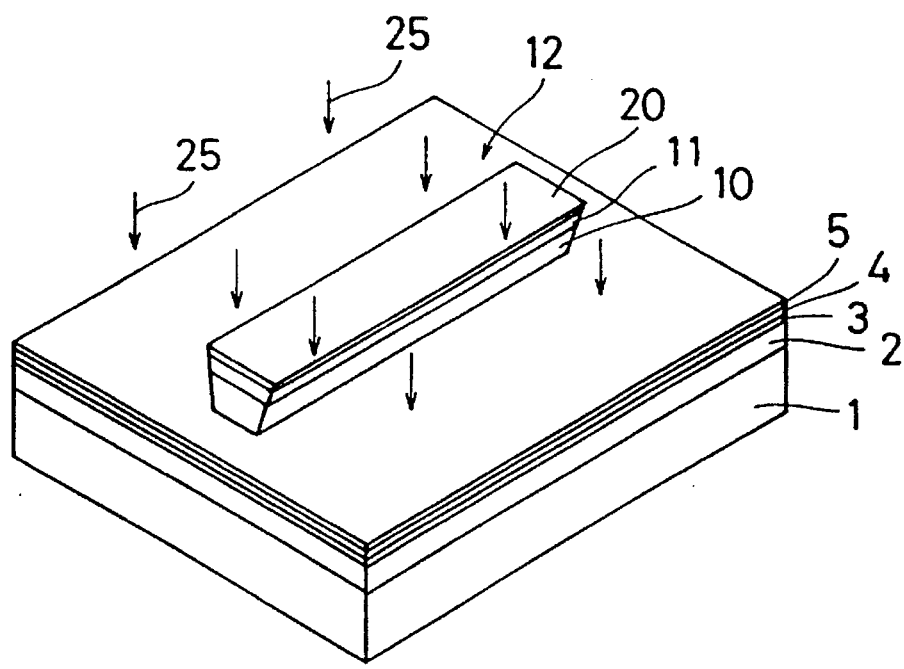
FIG. 5 is a perspective view illustrating a process step of ion-implantation in a production method of a semiconductor laser in accordance with a second embodiment of the present invention.

FIG. 5 is a perspective view illustrating a process step for producing a semiconductor laser according to a second embodiment of the present invention, which can solve the above-described problems. In this second embodiment, ion-implantation of silicon 25 is carried out over the entire surface of the wafer, without producing the photoresist film 21, after forming the ridge 12 by etching as shown in FIG. 2(c) in the production method of the above-described first embodiment. According to this method, although the quantum well structure layer 14 disordered by ion-implanted silicon 25 is formed over the entire quantum well structure layer 13 except a portion below the ridge 12, there are no problems in the device characteristics because the region of the quantum well structure layer 13, except a portion below the ridge 12, will be are covered by the current blocking layer 6. Then, since the insulating film 20 formed on the ridge 12 functions as a mask for the ion-implantation, the quantum well layer structure 3 below the ridge 12 serving as a waveguide path of the semiconductor laser is not disordered.

In this second embodiment described above, since no photoresist is used for the ion-implantation, no problem arises like contaminations of the wafer surface with the same effects as in the first embodiment.

Embodiment 3.

In the semiconductor laser 15 of the first embodiment, because the current blocking layer 6 comprises $Al_{r1}Ga_{1-r1}As$ (r1=0) and the ridge 12 is not present in the vicinity of the window structure 14, the laser light passing through the window structure region 14 is subjected to absorption by a portion of the current blocking layer 6 located in the vicinity of the window structure. As a result, the resonator loss of the semiconductor laser 15 increases and the threshold current increases to some degree.

Figure 6:
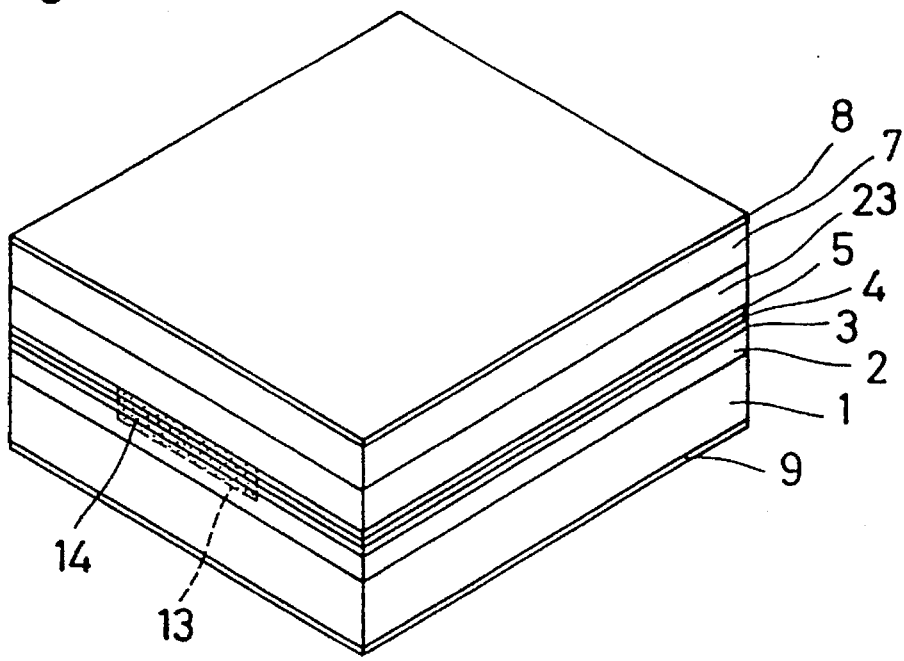
FIG. 6 is a perspective view illustrating a structure of a semiconductor laser in accordance with a third embodiment of the present invention.

FIG. 6 is a perspective view illustrating a structure of a semiconductor laser according to a third embodiment of the present invention, which can solve the above described problem. In this third embodiment, the current blocking layer 6 of the first embodiment is replaced by an n type $Al_{r1}Ga_{1-r}As$ (r1=0.7) current blocking layer 23 which is formed by selective growth.

Because the current blocking layer 23 comprises n type $Al_{r1}Ga_{1-r}As$ (r1=0.7) in place of n type $Al_{r1}Ga_{1-r1}As$ (r1=0), the energy band gap of the current blocking layer 23 is larger than the photon energy of the laser light emitted in the quantum well layer structure 3, and no light absorption occurs in the current blocking layer 23 in the vicinity of the window structure 14. Accordingly, a semiconductor laser 15 having a window structure that operates at lower threshold current and operational current than in the first embodiment is obtained.

Because the second cladding layer 10 of the ridge 12 has a larger refractive index than the current blocking layer 23 in this third embodiment, the laser light generated in the quantum well layer structure 3 is concentrated in the ridge 12 and the vicinity thereof as in an effective refractive index type laser, whereby the laser light which has a stable single mode pattern and a horizontal transverse mode is obtained, which mode is quite important in the semiconductor laser operation characteristics.

What is claimed is:

1. A semiconductor laser device comprising:

a first conductivity type semiconductor substrate having a front surface and a rear surface opposite said front surface;

a first conductivity type lower cladding layer disposed on the front surface of said semiconductor substrate;

an active layer including a multiple quantum well structure comprising alternatingly laminated barrier layers and well layers, disposed on said lower cladding layer, and having an effective energy band gap;

a second conductivity type upper cladding layer disposed on said multiple quantum well structure;

opposed facets transverse to said lower and upper cladding layers;

a ridge comprising a stripe-shaped second conductivity type semiconductor having a length extending in a laser resonator length direction of said semiconductor laser, spaced from said facets, disposed on said upper cladding layer, and having a refractive index;

a first conductivity type current blocking layer having an energy band gap larger than the effective energy band gap of said multiple quantum well structure and a refractive index smaller than the refractive index of said ridge, said current blocking layer being disposed on said upper cladding layer adjacent to, contacting, and surrounding said ridge;

a region disposed between said ridge and each of said facets adjacent each of said facets, and penetrating through said second conductivity type upper cladding layer and said multiple quantum well structure and into said first conductivity type lower cladding layer, and including a dopant impurity producing the first conductivity type conductivity in a concentration sufficient to disorder said multiple quantum well structure within the region without converting said second conductivity type upper cladding layer to the first conductivity type in said region:

a second conductivity type contact layer disposed on said current blocking layer and said ridge; and first and second electrodes disposed on said semiconductor substrate and said second conductivity type contact layer, respectively.

2. The semiconductor laser as defined in claim 1 wherein the region extends between said facets, outside and surrounding said ridge, said multiple quantum well structure being disordered throughout the region but not opposite said ridge.

3. A semiconductor laser comprising:

an n type GaAs semiconductor substrate having a front surface and a rear surface opposite said front surface;

an n type $Al_xGa_{1-x}As$ lower cladding layer having an energy band gap and disposed on the front surface of said semiconductor substrate;

an active layer including a multiple quantum well structure comprising alternatingly laminated $Al_yGa_{1-y}As$ barrier layers and $Al_zGa_{1-z}As$ ($0 \leq z < y$) well layers, having an effective energy band gap smaller than the energy band gap of said lower cladding layer, disposed on said lower cladding layer;

a p type $Al_wGa_{1-w}As$ upper cladding layer having an energy band gap larger than the effective energy band gap of said multiple quantum well structure, disposed on said multiple quantum well structure;

opposed facets transverse to said lower and upper cladding layers:

a ridge comprising a stripe-shaped p type $Al_rGa_{1-r}As$ layer having a length extending in a laser resonator length direction of said semiconductor laser, spaced from said facets, disposed on said upper cladding layer, and having a refractive index;

an n type $Al_tGa_{1-t}As$ ($t<r$) current blocking layer having an energy band gap larger than the effective energy band gap of said multiple quantum well structure and a refractive index smaller than the refractive index of said ridge, said current blocking layer being disposed on said upper cladding layer adjacent to, contacting, and surrounding said ridge;

a region disposed between said ridge and each of said facets adjacent each of said facets, penetrating through said p type $Al_wGa_{1-w}As$ upper cladding layer and said multiple quantum well structure and into said n type $Al_xGa_{a-x}As$ lower cladding layer and including silicon as a dopant impurity in a concentration sufficient to disorder said multiple quantum well structure within the region without converting said p type $Al_wGa_{1-w}As$ upper cladding layer to n type conductivity in said region, said multiple quantum well structure not being disordered opposite said ridge;

a p type GaAs contact layer disposed on said current blocking layer and said ridge; and first and second electrodes disposed on said semiconductor substrate and said second conductivity type contact layer, respectively.

4. The semiconductor laser as defined in claim 3 wherein the region extends between said facets, outside and surrounding said ridge, said multiple quantum well structure being disordered throughout the region but not opposite said ridge.

* * * * *

UNITED STATES PATENT AND TRADEMARK OFFICE
CERTIFICATE OF CORRECTION

PATENT NO. : 5,469,457
DATED : November 21, 1995
INVENTOR(S) : Nagai et al.

It is certified that error appears in the above-indentified patent and that said Letters Patent is hereby corrected as shown below:

Column 11, Line 47, change ":" to --;--;

Column 12, Line 20, change ":" to --;--;

Line 38, change "AlGa$_{a-x}$As" to --Al$_x$Ga$_{1-x}$As--;

Signed and Sealed this

Fourth Day of June, 1996

Attest:

BRUCE LEHMAN

*Attesting Officer*  *Commissioner of Patents and Trademarks*